US010176871B2

(12) United States Patent
Missiroli et al.

(10) Patent No.: US 10,176,871 B2
(45) Date of Patent: Jan. 8, 2019

(54) NAND FLASH MEMORY COMPRISING A CURRENT SENSING PAGE BUFFER PREVENTING VOLTAGE FROM DISCHARGING FROM A NODE DURING OPERATION

(71) Applicant: SK hynix Inc., Gyeonggi-do (KR)

(72) Inventors: Chiara Missiroli, Agrate Brianza (IT); Osama Khouri, Agrate Brianza (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/349,407

(22) Filed: Nov. 11, 2016

(65) Prior Publication Data

US 2017/0140823 A1    May 18, 2017

(30) Foreign Application Priority Data

Nov. 12, 2015  (IT) .......................... 102015000072011
Feb. 22, 2016  (IT) .......................... 102016000018123

(51) Int. Cl.
*G11C 16/04*    (2006.01)
*G11C 16/24*    (2006.01)
*G11C 16/26*    (2006.01)
*G11C 16/10*    (2006.01)
(Continued)

(52) U.S. Cl.
CPC .......... *G11C 16/0483* (2013.01); *G11C 16/10* (2013.01); *G11C 16/24* (2013.01); *G11C 16/26* (2013.01); *G11C 16/32* (2013.01); *G11C 16/3459* (2013.01); *G11C 2211/5642* (2013.01)

(58) Field of Classification Search
CPC ......................... G11C 11/161; G11C 11/1673; G11C 11/1675
See application file for complete search history.

(56) References Cited

U.S. PATENT DOCUMENTS

2010/0157673 A1*  6/2010  Ota ..................... G11C 11/5628
                                                          365/185.03
2013/0083607 A1    4/2013  Joo et al.
2014/0036599 A1    2/2014  Mun
(Continued)

FOREIGN PATENT DOCUMENTS

WO    WO 2015/004712    1/2015

OTHER PUBLICATIONS

Extended Search Report Issued by Italian Patent office dated Jun. 24, 2016.

*Primary Examiner* — Pho M Luu
*Assistant Examiner* — Jerome Leboeuf
(74) *Attorney, Agent, or Firm* — IP & T Group LLP

(57) ABSTRACT

A page buffer circuit may include: a first node; a first switching circuit configured to pre-charge the bit-line based on a voltage provided to the first switching circuit; a sensing node; a second switching circuit configured to discharge the sensing node when the voltage value of the first node is lower than a voltage value associated with a voltage inputted to the second switching circuit during an evaluation period; a sense latch configured to latch a voltage being determined based on the voltage level of the sensing node, during a strobe period; and a third switching circuit configured to prevent the voltage value of the first node from being lower than a voltage value associated with a voltage inputted to the third switching circuit independently from the voltage at the sense latch.

26 Claims, 13 Drawing Sheets

(51) Int. Cl.
*G11C 16/32* (2006.01)
*G11C 16/34* (2006.01)

(56) References Cited

U.S. PATENT DOCUMENTS

| | | |
|---|---|---|
| 2014/0050028 A1 | 2/2014 | Funatsuki et al. |
| 2014/0355354 A1 | 12/2014 | Ahn |
| 2015/0023108 A1 | 1/2015 | Kang et al. |
| 2016/0035430 A1* | 2/2016 | Mui .................. G11C 7/067 |
| | | 365/185.18 |
| 2017/0243653 A1* | 8/2017 | Missiroli ............... G11C 16/24 |

* cited by examiner

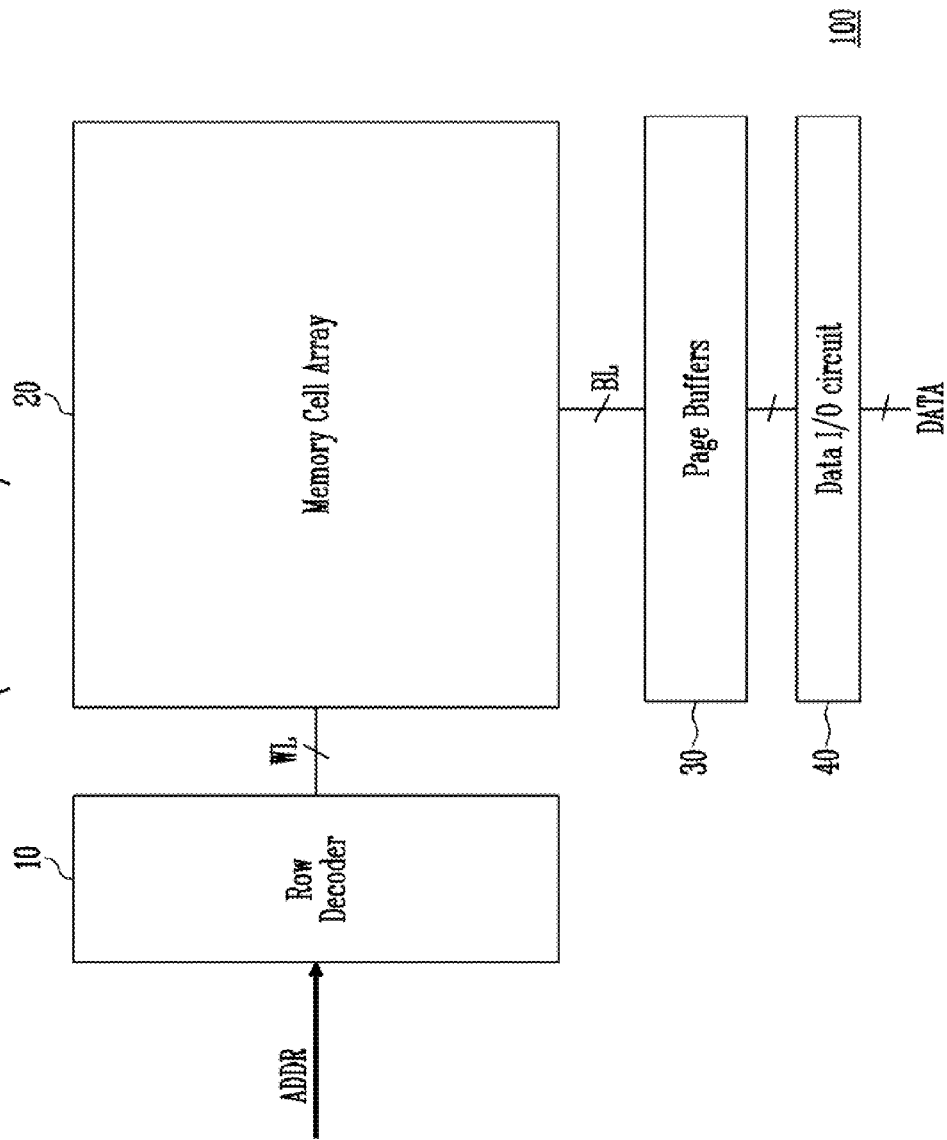

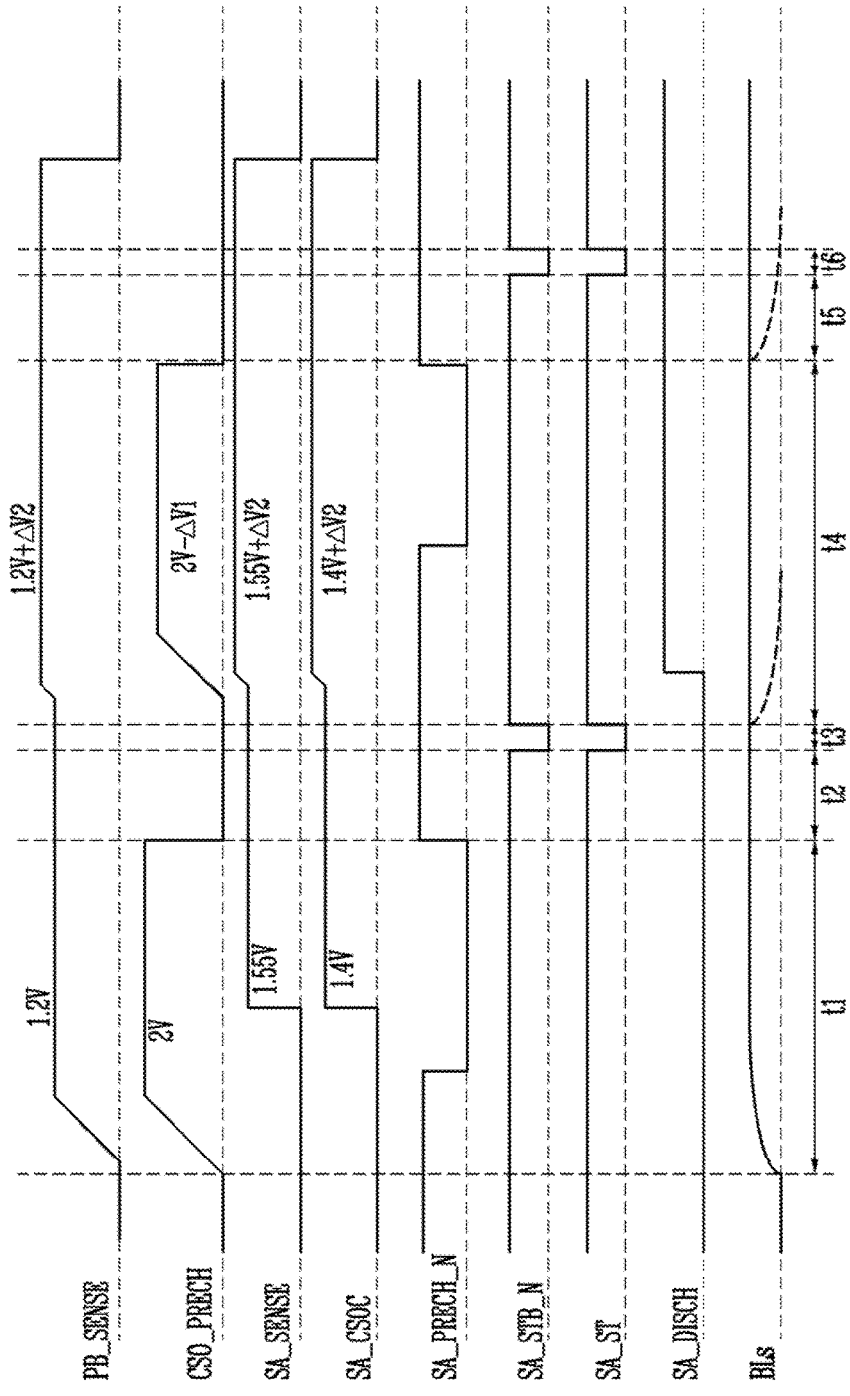

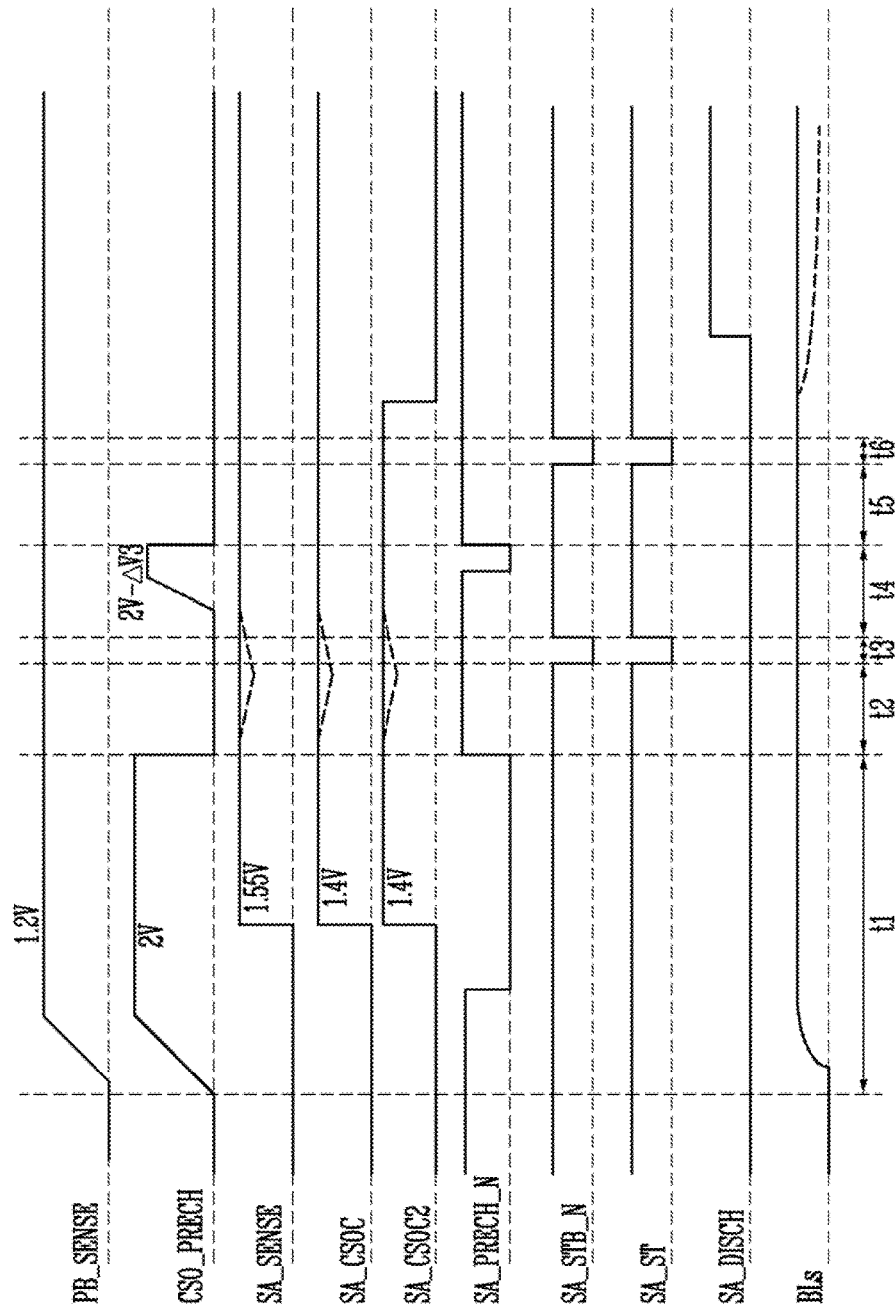

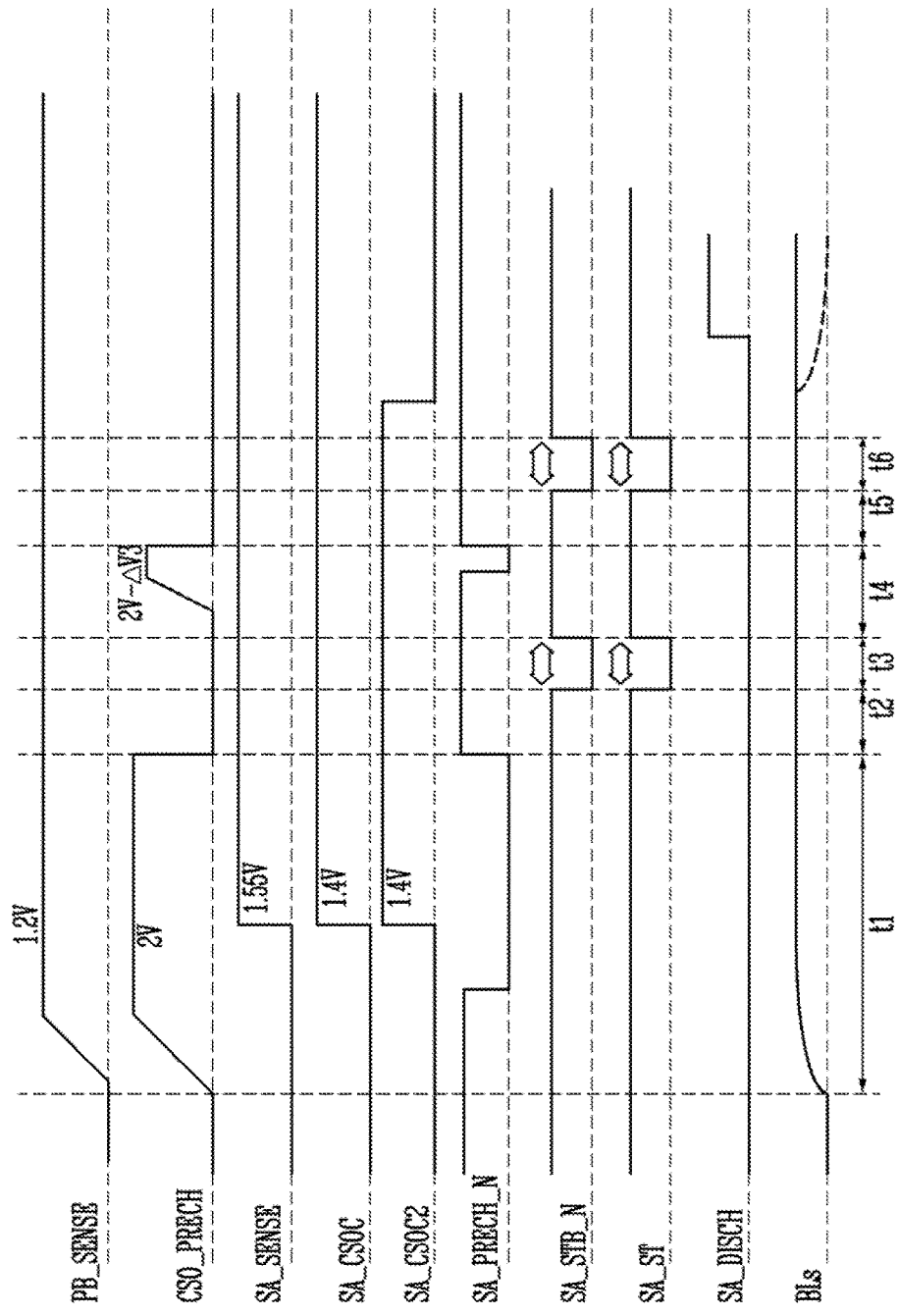

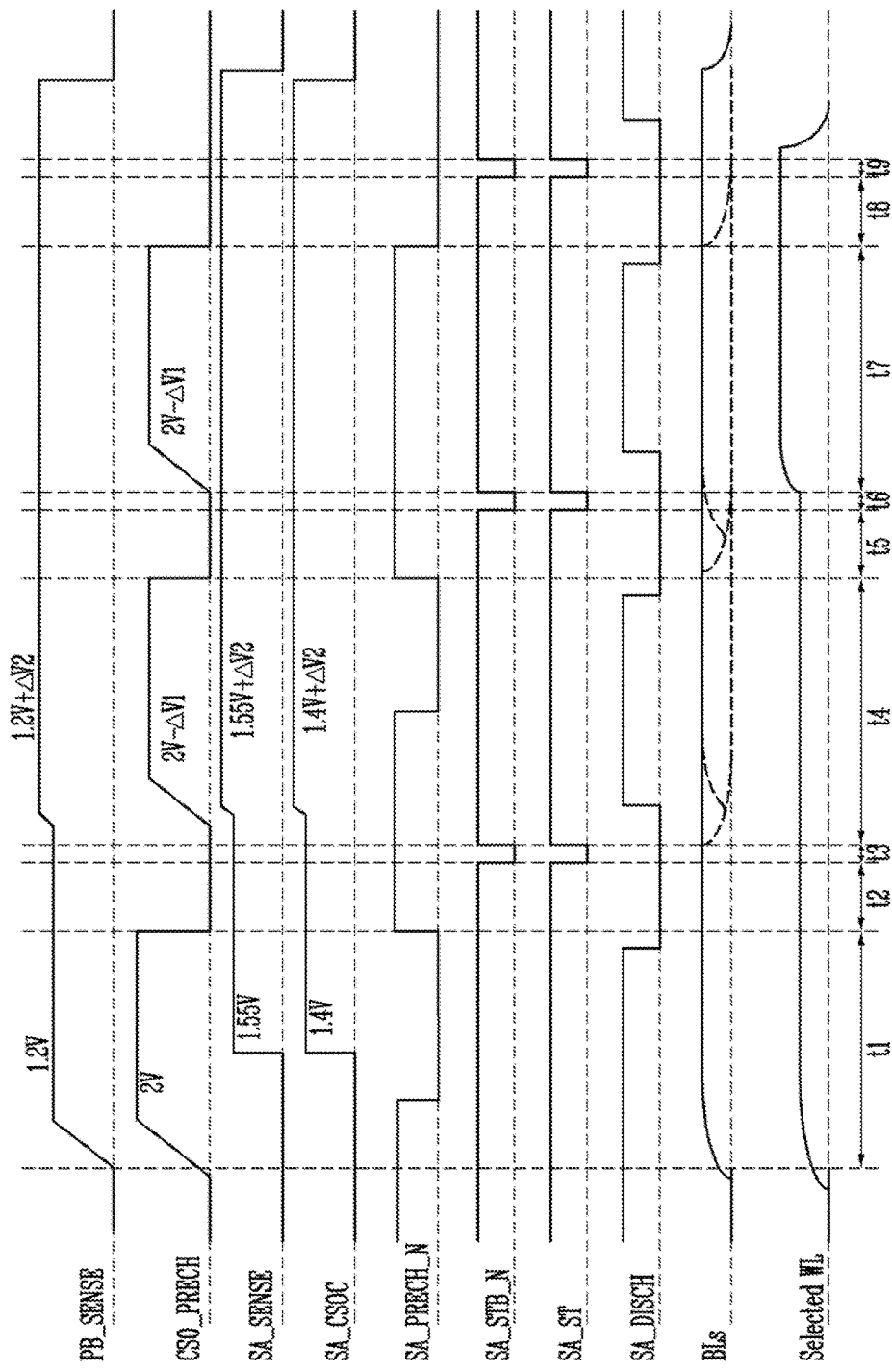

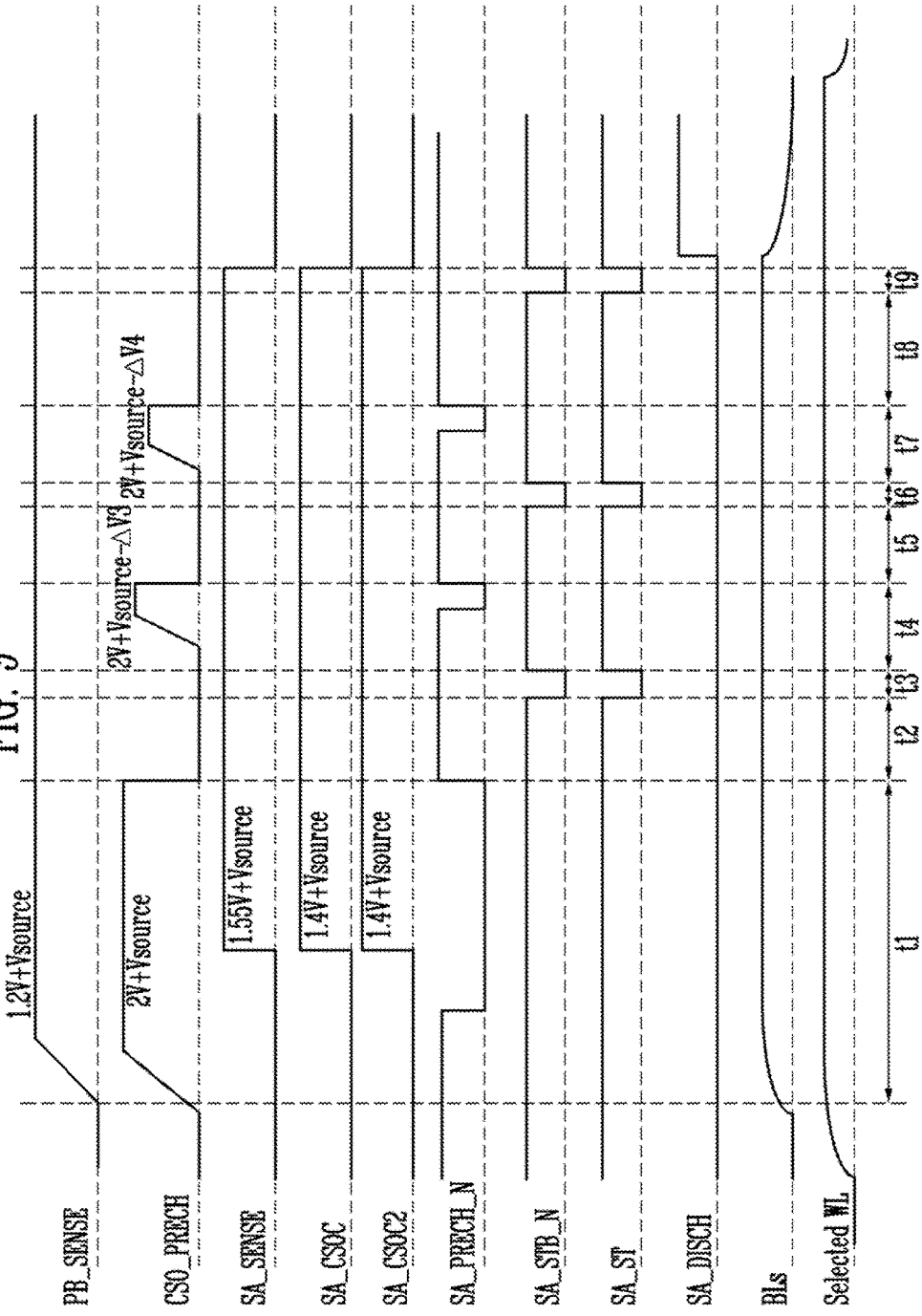

NAND FLASH MEMORY COMPRISING A CURRENT SENSING PAGE BUFFER PREVENTING VOLTAGE FROM DISCHARGING FROM A NODE DURING OPERATION

CROSS-REFERENCE TO RELATED APPLICATIONS

The present application claims priority of Italian Patent Application No. 102015000072011 filed on Nov. 12, 2015 and Italian Patent Application No. 102016000018123 filed on Feb. 22, 2016, which are incorporated herein by reference in their entirety.

BACKGROUND

1. Field

The present disclosure relates to a NAND flash memory comprising a current sensing page buffer, and a controlling method thereof. More particularly, but not exclusively, the disclosure relates to a NAND flash memory comprising a current sensing page buffer that is capable of controlling sensing current more precisely and tightly.

2. Description of the Related Art

Among various types of flash memory device, NAND flash memory devices are increasingly used as a high capacity data storage media. Each cell of a flash memory can be programmed to store information by trapping electrons in the cell. The programming operation may be performed, for example, by using the Fowler-Nordheim tunneling effect. A control gate is operatively connected to a word-line of the flash memory, and a voltage is provided to the control gate through the word-line. Each memory cell can be a single level memory cell (SLC), i.e., each cell can store a single bit. Alternatively, each cell may be a multiple level memory cell (MLC), i.e., each cell can store multiple bits. In both SLC and MLC cells, the information stored in each cell is defined by a corresponding threshold voltage of the memory cell.

FIG. 1A is a conceptual block diagram of a conventional NAND flash memory device 100. The flash memory device 100 of this example comprises a memory cell array 20, a page buffer circuit 30, a data input/output (I/O) circuit 40 and a row decoder 10. The memory cell array 20 is operatively connected to the page buffer circuit 30 through a plurality of bit-lines BL and is operatively connected to the row decoder 10 through a plurality of word-lines WL and an additional conductive line (not shown). The additional conductive line may be, for example, a drain selection line or a source selection line for addressing a specific string of the memory cell array. The memory cell array 20 includes a plurality of strings (not shown), each string including a plurality of memory cells. Each memory cell, i.e. the floating gate of each transistor, stores data which may be transferred from the page buffer circuit 30 with the control of the row decoder 10. Stored data in each memory cell may also be transferred to the page buffer circuit 30 with the control of the row decoder 10. Memory cells are arranged at intersections of the plurality of bit-lines BL and the plurality of word-lines WL, respectively.

The page buffer circuit 30 is operatively connected to the memory cell array 20 through the bit-lines BL and is operatively connected to the data input/output circuit 40. The page buffer circuit 30 sets the bit-lines BL during program, read, and erase operations, and senses the data stored in each memory cell of the memory cell array 20 in a read operation. The data input/output circuit 40 is operatively connected to the page buffer circuit 30. The data input/output circuit 40 exchanges data DATA with an external device. The data input/output circuit 40 transfers write data to the page buffer circuit 30 before a writing operation. The data input/output circuit 40 may include components, such as a data buffer and a column pass gate, which are well known in the art.

The row decoder 10 is operatively connected to the memory cell array 20. In operation, the row decoder 10 receives an external address ADDR for selecting any one of the word-lines WL1-WLm. The row decoder 10 is capable of driving the source selection line and the drain selection line of a string to which the addressed cells belong to. The row decoder 10 may apply various voltages, such as a program voltage, a pass voltage, a read voltage, and a ground voltage, to the word-lines WL according to the operation modes.

FIG. 1B is an exemplary block diagram of a memory cell array 20 of the flash memory 100 of FIG. 1A.

The block diagram FIG. 1B is explained herewith for ease of understanding of exemplary conventional structure of NAND flash memory, and not for limiting the invention to this specific scheme. For example, 3D NAND technology may adopt a different scheme than that shown in FIG. 1B.

The memory cell array 20 includes a plurality of blocks 50. Each block 50 includes a plurality of strings 60. Each string includes a plurality of memory cells in which data is stored. Memory cells are arranged at intersections of the plurality of bit-lines BL0~BLm and the plurality of word-lines WL0~WLr+k−1, respectively. Strings can be selected or deselected by a drain selection line, e.g. DSL0, DSLj, DSLn, and by a source selection line, e.g. SSL0, SSLj, SSLn. Bit-lines BL0~BLm of the memory cell array 20 are operatively connected to the page buffer circuit 30 of FIG. 1A. Word-lines WL, drain selection lines DSL and source selection lines SSL are operatively connected to the row decoder 10 of FIG. 1A.

FIG. 1C shows an exemplary structure of respective string and memory cells in the memory cell array of FIG. 1B.

FIG. 1C shows four strings 60. Each string 60 includes a plurality of memory cells 70 in which data is stored, e.g. in the floating gate. In the example of FIG. 1C, one string 60 includes four memory cells 70, but the number of the memory cells included in one string may vary depending on implementation. Memory cells 70 are arranged at intersections of the plurality of bit-lines BL0, BL1 and the plurality of word-lines WL0~WL7, respectively. Strings can be selected or deselected by controlling the drain selection line, e.g. DSL0, DSL1, and by controlling the source selection line, e.g. SSL0, SSL1. Bit-lines BL0, BL1 of the memory cell array 20 are operatively connected to the page buffer circuit 30 of FIG. 1A. Word-lines WL0~WL7, drain selection lines DSL0, DSL1 and source selection lines SSL0, SSL1 are operatively connected to the row decoder 10 of FIG. 1A.

The drain selection line DSL0 or DSL1 is operatively connected to the gate of the drain select transistor DST of each string. The source selection line SSL0 or SSL1 is operatively connected to the gate of the source select transistor SST of each string. The source select transistor SST connects each string to the source line SL, and can be switched. To make a specific string be coupled with a corresponding bit-line, high voltage can be driven to the gate of the SST and DST of the string to switch them on. Due to the drain select transistor DST, the source select transistor SST, the source selection line SSL and the drain selection line DSL, specific strings belonging to a same row can be specifically addressed to carry out one of operations such as program, erase, and read operations. The other strings not selected for the operation can be de-coupled from the bit-lines by driving low voltage to the gates of select transistors DST and SST of those strings.

Meanwhile, the architecture of NAND memory devices is driven from market requirements towards the introduction of large size pages together with reduced read latency and improved program throughput. The adoption of an all-bit-line (ABL) scheme has lead to the development of a current sensing scheme suitable to the concurrent reading of all the cells of a physical word-line at the same time, thus providing the considerable advantage of reading all the cells of a physical word-line at the same time and doubling the page size. Being possible to verify all the cells of a word-line concurrently also improved program performances. As a drawback, the current sensing scheme generally adopted in an ABL architecture requires keeping a constant voltage on all the bit-lines, during the whole evaluation and sensing phases with a direct current (DC) path from the bit-lines driving circuitry to the source line through the cells in the on state. As a consequence, the source line cannot be grounded efficiently and cells overdrive is affected by its variation, thus reducing the read current and compromising sensing precision. Various techniques have been introduced to mitigate source rising effect, but the most effective among them present the drawback of requiring at least two subsequent readings and increasing read time. Another issue which may arise is related to the noise generated inside sensing circuitry when all the cells of a page are sensed in parallel.

FIG. 2A shows a circuit diagram illustrating a conventional page buffer circuit 30 suitable to perform a current sensing.

The page buffer circuit 30 for a NAND flash memory comprises a first node CSO, an NMOS transistor M1 arranged between the first node CSO and a corresponding bit-line BL, an NMOS transistor M5, a sensing node SEN, a NMOS transistor M2 arranged between the first node CSO and the sensing node SEN, a transistor M4 configured to provide a pre-charging path to the bit-line BL through the first node CSO and the NMOS transistor M1 from a first voltage source VCORE. The page buffer circuit 30 further comprises the first voltage source VCORE, and a second voltage source VDC_PB.

The page buffer circuit 30 further comprises a PMOS transistor M6 coupled with the sensing node SEN and configured to switch the path from the second voltage source VDC_PB to a sense latch 31. The sense latch 31 is configured to receive at its input QS a drain voltage of the PMOS transistor M6. The input QS of the sense latch 31 is operatively connected to the gates of transistors M7 and M9 to enable or disable the current path from the first and second voltage sources, VCORE and VDC_PB, to each of the transistors M2, M4, M5 based on the voltage of the input QS of the sense latch 31.

The operation of the page buffer circuit 30 will be explained in reference to FIG. 2A and FIG. 2B. FIG. 2B shows a timing diagram of the page buffer circuit 30 of FIG. 2A performing a current sensing.

First, the sense latch 31 is reset so that the input QS is low, then all bit-lines BLs are pre-charged at the same time by rising a voltage PB_SENSE to the desired bit-line level plus a threshold in a pre-charge period t1. Pre-charge path is powered through the PMOS transistor M7, and the NMOS transistor M4 whose gate voltage is controlled to a desired voltage, e.g., 2V. These voltages are applied for a time sufficient to pre-charge the bit-lines, i.e. during the pre-charge period t1. The nodes CSO and SEN are isolated one from each other, and the pre-charge voltage of the node CSO is controlled to be equal to the voltage CSO_PRECH minus a threshold. Before the pre-charge period t1 ends, also the voltages SA_CSOC, SA_SENSE and SA_PRECH_N are enabled. The voltage SA_CSOC is driven to a voltage a bit higher than the voltage PB_SENSE, e.g., 1.4V, and SA_SENSE is driven to a voltage a bit higher than the voltage SA_CSOC, e.g., 1.55V.

While the pre-charge voltage of the node CSO is tightly controlled to a desired voltage by means of the CSO_PRECH transistor, M4, the node SEN is pre-charged to the voltage VDC_PB. Before the evaluation phase, the SA_DISCH transistor M11 is disabled.

A first evaluation period t2 starts when the CSO_PRECH voltage is grounded, and the voltage SA_PRECH_N, i.e., the gate of the transistor M7, rises to VDC_PB. The node CSO is now floating and eventually discharged by the current sunk from the cell. When it reaches the voltage SA_SENSE minus a threshold, the transistor M2 having the gate coupled to the voltage SA_SENSE turns on and the node SEN is discharged to the voltage of the node CSO. In the first evaluation period t2, the voltage SA_CSOC ensures that the node CSO is not discharged below an initial bit-line voltage plus a delta. As a consequence the bit-line voltage is kept constant and the bit-line to bit-line interference is suppressed.

After the first evaluation period t2, the strobe signal, i.e., SA_STB_N, is enabled. If the node SEN has been discharged, the PMOS transistor M6 is enabled and the input QS goes high, otherwise the latch data is maintained. When the strobe pulse of the voltage SA_STB_N ends, the voltages SA_SENSE, SA_CSOC, PB_SENSE are raised to a higher voltage, i.e., +ΔV2, and the voltages SA_PRECH_N and SA_DISCH are reasserted during a recovery period t4.

During the read sequence just described above, the cells are all enabled in parallel and the voltage of the bit-lines BL is kept constant. The huge current sunk from the bit-line driving circuitry to the cells through common source line SL causes it to rise of a few hundred mV so that the gate-to-source voltage of the cells is reduced. This phenomenon results in a lower cell current and can reduce the read margin of the erased cells. Due to this effect, the reading is repeated in safer conditions. After the first reading including the pre-charge period t1, the first evaluation period t2, and the first strobe period t3, the sense latch 31 of the page buffer unit 30 with high read current is flipped to have the input QS high, and the pre-charge path to the bit-line BL is prevented by the transistors M7 and M9.

A discharge path is enabled through the transistors M11 and M12 having the gate coupled to the voltage SA_DISCH which is disabled during the first sensing phase t1~t3, but re-activated thereafter. The bit-lines BLs operatively connected to the cell with high current are discharged, while others are pre-charged again if eventually coupled down by adjacent bit-lines BLs under discharge. The page buffer control voltages PB_SENSE are raised to higher level, e.g., +200 mV, in order to have higher BL voltage and, after the recovery period t4, a second evaluation period t5 and a second strobe period t6 are repeated.

The bit-line BL is pre-charged with the transistor M1 having its gate biased by the voltage PB_SENSE and its sub-threshold leakage can compromise the reading. In other words, during the pre-charge period t1, the gate voltage of the transistor M1, i.e., PB_SENSE, is kept constant, but the source voltage of the transistor M1 rises. The pre-charge of the bit-line BL is very slow due to the current reduction of the transistor M1 during the last part of the transient, caused by the reduced difference between the gate and source voltages. The last part of the bit-line pre-charge is actually performed with the transistor M1 in the cut-off region, which causes a sub-threshold leakage.

For this reason, the recovery period t4 should be long enough, e.g., up to 10 µs, which significantly increases the reading duration.

The introduction of two subsequent readings, however, solves another issue related to the commutation noise produced by the sensing of all cells of the page in parallel. Since the nodes CSO of the page buffers with erased cells are discharged during the evaluation period, the parasitic capacitance of the transistors can couple down the analog control signals, such as PB_SENSE, SA_CSOC and SA_SENSE. Since the evaluation time (t2+t3) is very short and more time is required for the recoveries of the voltages of the analog control signals, the drop on these lines can affect the sensing precision significantly. On second reading, the number of erased cells still under reading is dramatically reduced and this drop becomes negligible, thus proving a more stable and precise reading.

As the program operation, an incremental step pulse programming (ISPP) technique is usually used, which is well adapted for use with a range of threshold voltages defining multiple programming states for a MLC.

After every program pulse, a program verify operation is performed to check if the cells are programmed at a required Vth level. The program verify operation is a read operation. In MLC and TLC, the number of levels to be programmed is 4 and 8 respectively, so the program verify operation needs to be performed 3 or 7 times after every program pulse. ISPP with all verify operations will continue until all levels are verified correctly, so that the program time is strongly dependant on the program verify time inducing a program throughput issue. Moreover, in prior art, a common program technique includes the double verification for each distribution under program in order to apply a program pulse with reduced efficiency after verification, when cells have been programmed not to the final verify value, but close to and slight lower than the final verify value. This is a time consuming operation which will be addressed in the following for program time reduction.

SUMMARY

One aspect of the present application are directed to a sensing method and circuitry which ensures a reliable reading without increasing the latency time. Another aspect of the present invention is directed to an improved, more efficient method for reducing a program verify time and improving program throughput.

Yet another aspect of the invention are directed to a page buffer circuit and a current sensing method which ensures the advantages of current sensing with shorter recovery period.

In an embodiment of the invention, a flash memory includes a bit-line and a page buffer circuit. The page buffer circuit may include: a first node; a first switching circuit arranged between the first node and the bit-line, configured to pre-charge the bit-line based on a voltage provided to the first switching circuit, during a pre-charge period; a sensing node; a second switching circuit arranged between the first node and the sensing node, configured to discharge the sensing node when the voltage value of the first node is lower than a voltage value associated with a voltage inputted to the second switching circuit during an evaluation period; a sense latch configured to latch a voltage being determined based on the voltage level of the sensing node, during a strobe period; and a third switching circuit configured to prevent the voltage value of the first node from being lower than a voltage value associated with a voltage inputted to the third switching circuit independently from the voltage at the sense latch.

The page buffer circuit may further include a fourth switching circuit configured to provide a pre-charging path to the bit-line through the first node and the first switching circuit from a first voltage source during the pre-charging period.

The page buffer circuit may further include a fifth switching circuit configured to prevent the voltage value of the first node from being lower than a voltage value associated with a voltage inputted to the fifth switching circuit.

According to an embodiment of the invention, a method for controlling page buffers of a NAND flash memory in a current sensing operation is disclosed. The current sensing operation is performed during a first reading operation and a second reading operation. The first reading operation may comprise a pre-charge period, a first evaluation period and a first strobe period, and the second reading operation may comprise a recovery period, a second evaluation period and a second strobe period. All bit-lines sensed by the page buffers maintain their previous voltage levels during the second reading operation.

BRIEF DESCRIPTION OF THE DRAWINGS

These and other characteristics and advantages of the invention will become apparent from the following detailed description with reference to the annexed drawings, in which FIG. 1A is a conceptual block diagram of conventional NAND flash memory device.

FIG. 2B shows a timing diagram of the page buffer circuit of FIG. 2A performing a current sensing.

FIG. 4A shows a timing diagram of operation of the page buffer circuit according to FIG. 3.

FIG. 7 shows a timing diagram of control sequences where the relative length of the strobe periods t3 and t6 are increased.

FIG. 8 shows a timing diagram of the program verify sequences according to the prior art.

FIG. 9 shows a timing diagram of the program verify sequences applicable to the first, second, and third embodiments of the invention.

DETAILED DESCRIPTION

Figure 1B:
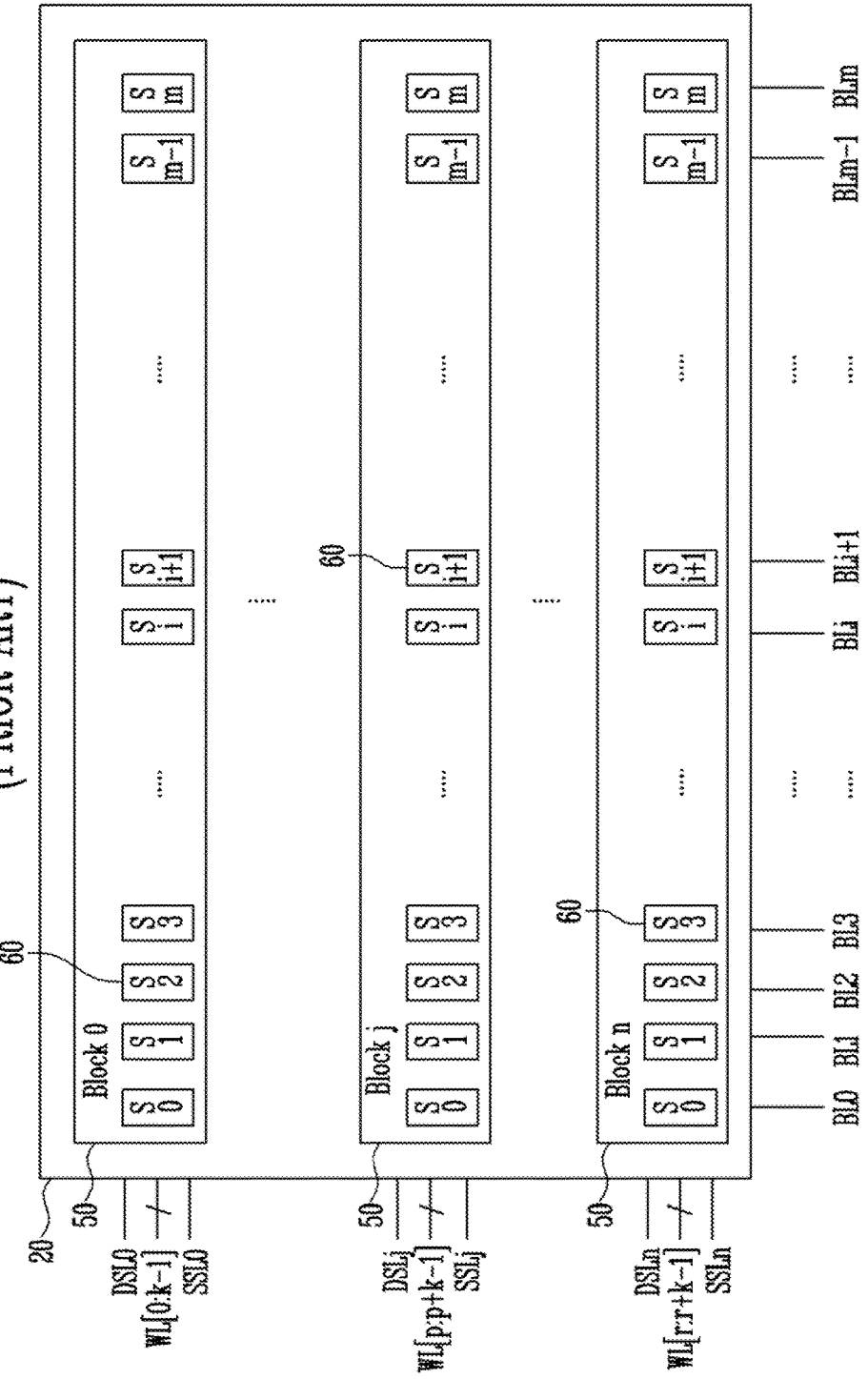
FIG. 1B is an exemplary block diagram of a memory cell array of the flash memory of FIG. 1A.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, it should be construed as a meaning and concepts for complying with the technical idea of the present invention. In addition, detailed descriptions of constructions well known in the art may be omitted to avoid unnecessarily obscuring the gist of the present invention.

In the drawings, corresponding features are identified by the same reference numerals.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 3:
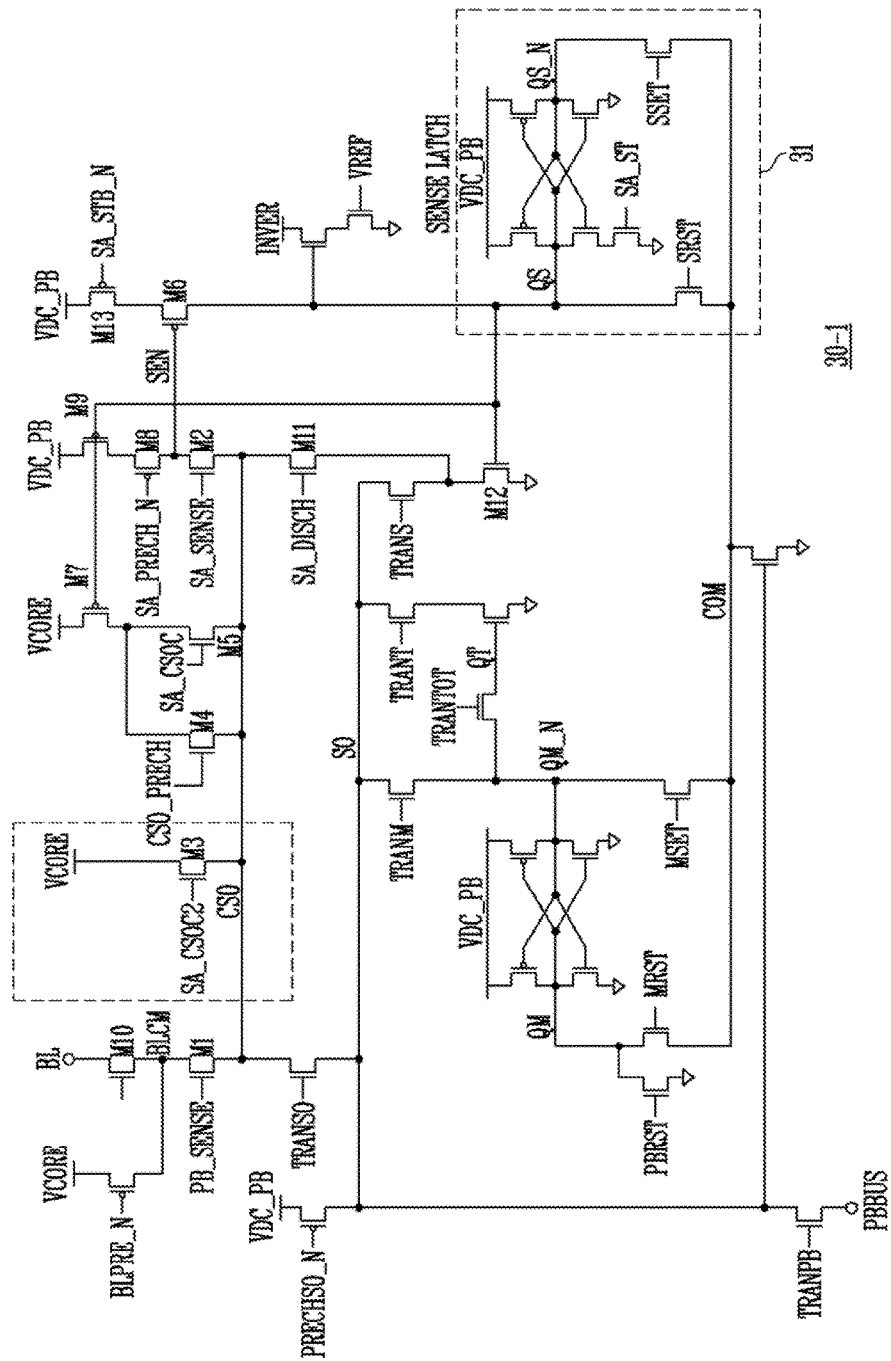
FIG. 3 shows a circuit diagram illustrating a page buffer circuit, according to a first embodiment of the invention.

FIG. 3 shows a page buffer circuit 30-1 according to a first embodiment of the invention.

The structure of the page buffer circuit 30-1 is briefly illustrated first, and the detailed operation of the page buffer circuit 30-1 is explained referring to FIG. 4 later.

Referring to FIG. 3, the page buffer circuit 30-1 for a NAND flash memory comprises a first node CSO, a first switching circuit M1 arranged between the first node CSO and a corresponding bit-line BL, a sensing node SEN, a second switching circuit M2 arranged between the first node CSO and the sensing node SEN, a fourth switching circuit M4 configured to provide a pre-charging path to the bit-line BL through the first node CSO and the first switching circuit M1 from a first voltage source VCORE. The page buffer circuit 30-1 further comprises a third switching circuit M3 configured between the first node CSO and a first voltage source VCORE to prevent the voltage value of the first node CSO from being lower than a specific value. The fourth switching circuit M4 and a fifth switching circuit M5 are coupled in parallel between the first node CSO and a second node SN. A switching circuit M7 is coupled between a first voltage VCORE and the second node SN and has its gate coupled to the input node QS of the sense latch 31.

In FIG. 3, the first to fifth switching circuits M1~M5 may be n-type MOS FETs, i.e., NMOS transistors, but the embodiment is not limited thereto. The page buffer circuit 30-1 further comprises the first voltage source VCORE, and a second voltage source VDC_PB.

The first switching circuit M1 comprises a first NMOS transistor M1 and is arranged between the first node CSO and a third node BLCM which is coupled via a tenth switching circuit M10 to the bit-line BL and configured to pre-charge the bit-line BL based on the gate voltage PB_SENSE of the first NMOS transistor M1 minus the threshold voltage $V_{th\_M1}$, of the first NMOS transistor M1. In this way, the first NMOS transistor M1 has a first terminal electrically coupled to the first node CSO, opposite to a second terminal coupled to third node BLCM to which the bit-line BL is in turn electrically coupled via the tenth switching circuit M10.

The second switching circuit M2 comprises a second NMOS transistor M2. The first node CSO is electrically coupled to the source of the second NMOS transistor M2, and the sensing node SEN is electrically coupled to the drain of the second NMOS transistor M2. The second NMOS transistor M2 is configured to discharge the sensing node SEN when the voltage value of the first node CSO is lower than the gate voltage SA_SENSE of the second NMOS transistor M2 minus the threshold voltage $V_{th\_M2}$ of the second NMOS transistor M2 during the evaluation period. In this way, the second NMOS transistor M2 has a terminal electrically coupled to the first node CSO, opposite to a terminal to which the sensing node SEN is in turn electrically coupled.

The third switching circuit M3 comprises a third NMOS transistor M3. The first node CSO is electrically coupled to the source of the third NMOS transistor M3, and the voltage from the first voltage source VCORE is provided to the drain of the third NMOS transistor M3. The third NMOS transistor M3 is configured to prevent the voltage value of the first node CSO from being lower than the gate voltage SA_CSOC2 of the third NMOS transistor M3 minus the threshold voltage $V_{th\_M3}$ of the third NMOS transistor M3 independently from the voltage at the input node QS of the sense latch 31 which is determined based on the voltage level of the sensing node SEN of a strobe period t3 or t6. In this way, the third NMOS transistor M3 has a terminal electrically coupled to the first node CSO, opposite to a terminal to which the voltage of the first voltage source VCORE is provided.

The fourth switching circuit M4 comprises a fourth NMOS transistor M4. The source of the fourth NMOS transistor M4 is electrically coupled with the first node CSO, and the drain of the fourth NMOS transistor M4 is coupled to the second node SN which is in turn coupled to the voltage source VCORE via the seventh switching circuit M7. Hence, the drain of the fourth NMOS transistor M4 is provided with the voltage from the first voltage source VCORE when the seventh switching unit M7 is on. The seventh switching unit is a PMOS transistor having its gate coupled to the input node QS of the sense latch circuit 31. The pre-charging path for the bit-line BL does not include the sensing node SEN. The fourth NMOS transistor M4 is configured to raise the voltage of the first node CSO up to the gate voltage CSO_PRECH of the fourth NMOS transistor M4 minus the threshold voltage $V_{th\_M4}$ of the fourth NMOS transistor M4 during the pre-charge period t1. In this way, the fourth NMOS transistor M4 has a terminal electrically coupled to the first node CSO, opposite to a terminal to which the voltage of the first voltage source VCORE is provided when the seventh switching circuit M7 is on.

The page buffer circuit 30-1 may further comprise a fifth switching circuit M5. The fifth switching circuit M5 comprises a fifth NMOS transistor M5 and is configured to prevent the voltage value of the first node CSO from being lower than the gate voltage SA_CSOC of the fifth NMOS transistor M5 minus threshold voltage $V_{th\_M5}$ of the fifth NMOS transistor M5. The drain and source of the fourth NMOS transistor M4 are electrically coupled with the drain and source of the fifth NMOS transistor M5, respectively.

The page buffer circuit 30-1 may further comprise a second voltage source VDC_PB; the sense latch 31; and a sixth switching circuit M6 coupled with the sensing node SEN and configured to switch the path from the second voltage source VDC_PB to the sense latch 31. The sixth switching circuit M6 comprises a first PMOS transistor M6. The sense latch 31 is configured to receive at its input node QS a voltage based on the voltage outputted from the sixth switching circuit M6, e.g., the drain voltage of the first PMOS transistor M6, to enable or disable current paths from the voltage sources VCORE, VDC_PB to the second, fourth and fifth NMOS transistors M2, M4 and M5. The sensing node SEN is electrically coupled to the gate of the first PMOS transistor M6. The drain of the first PMOS transistor M6 is electrically coupled to the input node QS of the sense latch 31.

The page buffer circuit 30-1 may further comprise a seventh switching circuit M7 configured to switch current paths from the first voltage source VCORE to the fourth and fifth switching circuits M4 and M5 based on the voltage of the input QS of the sense latch 31. The seventh switching circuit M7 comprises a second PMOS transistor M7. The gate of the second PMOS transistor M7 is electrically coupled with the input QS of the sense latch 31. The page buffer circuit 30-1 may further comprise an eighth switching circuit M8 configured to charge the sensing node SEN during the pre-charge period t1 up to the voltage of the first voltage source VCORE or the second voltage source VDC_PB. In FIG. 3, the sensing node SEN is charged to the voltage of the second voltage source VDC_PB. The eighth switching circuit M8 may comprise a third PMOS transistor M8, but the embodiment is not limited thereto. The gate voltage SA_PRECH_N of the third PMOS transistor M8 is controlled to pre-charge the sensing node SEN.

The page buffer circuit 30-1 may further comprise a ninth switching circuit M9 configured to switch current path from the second voltage source VDC_PB to the sensing node SEN based on the voltage of the input QS of the sense latch 31. The ninth switching circuit M9 comprises a fourth PMOS transistor M9, and the gate of the fourth PMOS transistor M9 is electrically coupled with the input QS of the sense latch 31. The sensing node SEN is isolated from the first node CSO during the pre-charge period t1.

FIG. 4A shows a timing diagram of operation of the page buffer circuit 30-1 according to FIG. 3.

The operation comprises a first reading and a second reading. The first reading comprises the pre-charge period t1, a first evaluation period t2, a first strobe period t3. The second reading comprises a recovery period t4, a second evaluation period t5, and a second strobe period t6.

First, the pre-charging period t1 starts. The sense latch 31 is reset, i.e., the input QS of the sense latch 31 becomes low. Then, all bit-lines, e.g., BL0~BLm of FIG. 1B, are pre-charged at the same time by raising the voltage PB_SENSE, e.g., 1.2V, of the first NMOS transistor M1 to the desired bit-line level plus the threshold voltage $V_{th\_M1}$ of the first NMOS transistor M1. Pre-charge path to the bit-line BL is powered through the fourth NMOS transistor M4 by raising the gate voltage CSO_PRECH thereof to a desired voltage, e.g., 2V, as shown in FIG. 4A. These voltages are applied for a while which is sufficient to pre-charge the bit-lines BLs during the pre-charge period t1. The gate voltage CSO_PRECH of the fourth NMOS transistor M4 is controlled such that the final voltage of the first node CSO becomes equal to the gate voltage CSO_PRECH minus the threshold voltage $V_{th\_M4}$ of the fourth NMOS transistor M4, e.g., $2V-V_{th\_M4}$.

The first node CSO and the sensing node SEN are isolated from each other during the pre-charge period t1, because the gate voltage SA_SENSE of the second NMOS transistor M2 is driven to a low voltage for a moment at the start of the pre-charging period t1.

Before the pre-charge period t1 ends, the gate voltage SA_CSOC of the fifth NMOS transistor M5, the gate voltage SA_CSOC2 of the third NMOS transistor M3, the gate voltage SA_SENSE of the second NMOS transistor M2, and the gate voltage SA_PRECH_N of the third PMOS transistor M8 are set to enable respective transistors M5, M3, M2 and M8. The gate voltages SA_CSOC and SA_CSOC2 are driven to a voltage a bit higher than the voltage PB_SENSE, e.g., 1.4V. The gate voltage SA_SENSE is driven to a voltage a bit higher than the gate voltage SA_CSOC, e.g., 1.55V.

The following condition is met near the final phase of the pre-charge period t1:
CSO_PRECH>SA_SENSE>SA_CSOC= SA_CSOC2>PB_SENSE In the example of FIG. 4A, CSO_PRECH is 2V, SA_SENSE is 1.55V, SA_CSOC and SA_CSOC2 are 1.4V, and PB_SENSE is 1.2V, and the above condition is met.

In a general way, being the voltages provided to each of the first, second, third, fourth and fifth switching circuits defined as V1, V2, V3, V4, and V5 respectively, during at least a portion of Interval of the pre-charge period t1 the following conditions are met: V4>V2>V3=V5>V1.

The sequences presented in FIG. 4A are optional and can be easily modified without compromising the functionality or modifying the idea of the embodiment of the invention.

At the beginning of the pre-charge period t1, one of the second NMOS and third PMOS transistors, M2 and M8, receiving at the respective gate the voltage SA_SENSE and SA_PRECH_N is disabled, thus preventing a current path formed from the second source VDC_PB to the bit-line BL through the sensing node SEN.

After the gate voltage CSO_PRECH of the fourth NMOS transistor M4 has reached the desired voltage, e.g., 2V, the gate voltage SA_PRECH_N of the third PMOS transistor M8 is grounded, and then a voltage, e.g., 1.55V, lower than the desired voltage of the gate voltage CSO_PRECH of the fourth NMOS transistor M4, e.g., 2.0V, can be driven to the gate voltage SA_SENSE of the second NMOS transistor M2.

The first node CSO and the sensing node SEN are isolated from each other by driving the gate voltages CSO_PRECH>SA_SENSE such that the second NMOS transistor M2 is not turned on in the pre-charge period t1.

Figure 1C:
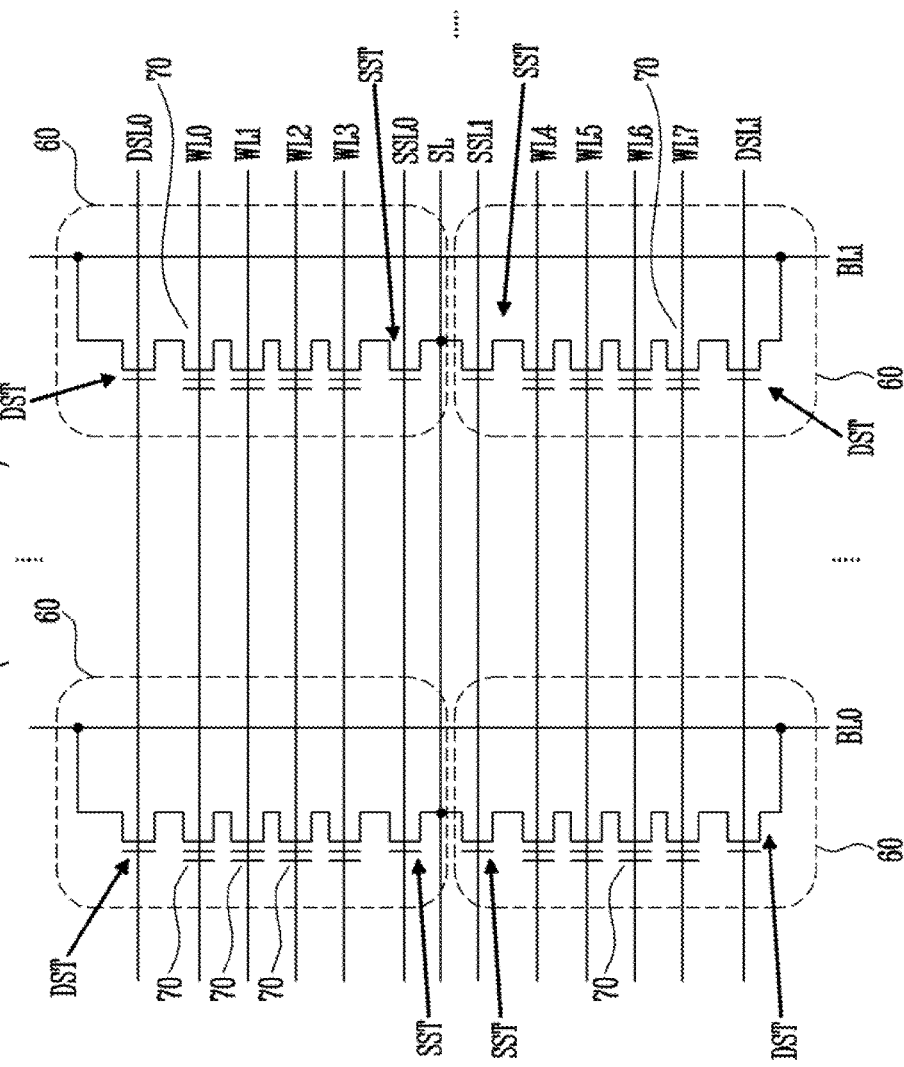
FIG. 1C shows an exemplary structure of respective string and memory cells in the memory cell array of FIG. 1B.

During or before the pre-charge period t1, voltages of word-line and select lines WL, SSL, DSL (FIG. 1B) are raised to ensure the conductive path from the bit-line BL to the source line SL (FIGS. 1B & 1C), depending on the cell status. A further transistor M11 is disabled by driving a low voltage to its gate voltage SA_DISCH during the whole first and the second reading period t1~t6.

When the first evaluation period t2 starts, the gate voltage SA_PRECH_N of the eighth switching circuit M8 has been high, and the gate voltage CSO_PRECH of the fourth NMOS transistor M4 is grounded. When the eight switching circuit M8 is a PMOS transistor, it is disabled by raising its gate voltage SA_PRECH_N. This can be advantageous over the eight switching circuit M8 being an NMOS transistor, as the sensing node SEN is not discharged by the gate transistor coupling effect of the eighth switching circuit M8 in case it is a PMOS.

During the first evaluation period t2, the first node CSO is being discharged by the current sunk from the cell. At the start of the first evaluation period t2, the voltage of the first node CSO is higher than the gate voltage SA_SENSE minus the threshold voltage $V_{th\_M2}$ of the second NMOS transistor M2.

If the voltage of the first node CSO decreases and reaches $V_{SA\_SENSE}-V_{th\_M3}$, the third NMOS transistor M3 turns on, and the sensing node SEN is discharged through the first node CSO. If the parasitic capacitance of the sensing node SEN is negligible with respect to the parasitic capacitance of the first node CSO, the voltage of the sensing node SEN immediately equals the voltage of the first node CSO, after the second NMOS transistor M2 is turned on.

If the first node CSO is not discharged at all or the first node CSO is discharged slightly, such that its voltage is above $V_{SA\_SENSE}-V_{th\_M2}$, the second NMOS transistor M2 is not turned on, and the voltage VDC_PB, i.e. the initial voltage charged to the sensing node SEN after the pre-charge period t1, is preserved on the sensing node SEN at the end of the first evaluation period t2.

During the first evaluation period t2, the voltages SA_CSOC2 and SA_CSOC, i.e., the gate voltages of the third NMOS transistor M3 and the fourth NMOS transistor M4, ensures that the first node CSO is not discharged below the initial bit-line voltage BL plus a delta. As a consequence, the voltage of the bit-line BL is kept constant, thereby bit-line to bit-line interference in ABL scheme can be suppressed.

After the first evaluation period t2, the strobe signals SA_STB_N and SA_ST are enabled with the beginning of the first strobe period t3. Lowering voltage of the gate voltage SA_STB_N of a further PMOS transistor M13 causes the source of the first PMOS transistor M6 to be provided with the voltage of the second source VDC_PB on its source. If the sensing node SEN has been discharged, the first PMOS transistor M6, acting as a sensing transistor, is enabled, and the input QS of the sense latch 31 goes high. Otherwise, the input QS of the sense latch 31 is maintained. After the first strobe period t3, the input QS of the sense latch 31 comes to store a voltage which is dependent on the voltage of the sensing node SEN during the first strobe period t3. The latched voltage QS after the first strobe period t3 can be used to determine whether the charge of the first node CSO has been sufficiently discharged according to Equation 1 explained below.

The second strobe period t6 follows the second evaluation period t5. The operation of the page buffer circuit 30-1 in the second strobe period t6 is similar to that of the first strobe period t3.

The third NMOS transistor M3, having the gate biased by the gate voltage SA_CSOC2 and powered directly from the first voltage source VCORE, keeps the first node CSO higher than the desired bit-line voltage BL independently on the data latched on the input QS of the sense latch 31. As a consequence, all the bit-lines are kept a constant voltage and not discharged in the recovery period t4 and the second evaluation period t5, even if the related cell has been read as erased. Also, page buffer analog control voltages such as PB_SENSE and SA_CSOC2 are not modified and kept to the same values of previous reading. This allows short-ends the recovery period t4 which is the most time consuming operation in the whole read sequence.

The second evaluation period t5 and the second strobe period t6 can now be repeated without excessive time overhead. The bit-line BL voltage being stable, only the first node CSO is needed to be pre-charged. Since the fourth NMOS transistor M4 is powered to the first voltage source VCORE through the second PMOS transistor M7 having the gate biased by the voltage of the input QS of the sense latch 31, only the first nodes CSOs related to cells not previously read as erased are pre-charged in the second reading. The same happens for the nodes SEN recharged through the fourth PMOS transistor M9 having the gate biased by the voltage of the input QS of the sense latch 31 when the voltage SA_PRECH_N is grounded. During the following second evaluation period t5, starting with the transition of the voltages CSO_PRECH and SA_PRECH_N, the coupling noise on the control voltages is now negligible due to the significantly reduced number of the first nodes CSOs and the sensing nodes SENs being pre-charged again during the recovery period t4. This allows performing more precise sensing with a tighter control of analog voltages.

As seen from the operation of FIG. 4A, the condition to flip the sense latch 31 is satisfied when the sensing node SEN is discharged to the first node CSO. This happens when the cell current discharges the first node CSO to $V_{SA\_SENSE}-V_{th\_M2}$. Since the first node CSO has been pre-charged to $V_{CSO\_PRECH}-V_{th\_M4}$, under the hypothesis that the parasitic capacitance of the sensing node SEN is negligible respect to the parasitic capacitance of the first node CSO, the read current Itrip can be calculated as the Equation 1 below:

$$Itrip=(V_{CSO\_PRECH}-V_{th\_M4}-(V_{SA\_SEN}-V_{th\_M2}))*C_{CSO}/T_{eval}=(V_{CSO\_PRECH}-V_{SA\_SEN})*C_{CSO}/T_{eval} \quad (1)$$

In the Equation 1, the second and fourth NMOS transistors M2 and M4 can be designed and implemented so that their threshold voltages are equal to each other (i.e., $V_{th\_M4}=V_{th\_M2}$).

The power supplies VCORE and VDC_PB do not enter the above Equation 1 at least as first order approximation, so the voltage drop of the power supply VCORE caused by source bouncing does not affect the Equation 1.

The read current Itrip of the Equation 1 can be easily modulated to be matched with the desired value by controlling the difference between $V_{CSO\_PRECH}$ and $V_{SA\_SENSE}$. Especially, if analog control voltages of the page buffer circuit such as SA_SENSE, SA_CSOC, CSO_PRECH, etc. are all produced by the same voltage regulator and matched to each other, the embodiments can be very effective way to control the read current Itrip tightly.

Alternatively the read current Itrip can be controlled by increasing the evaluation time $T_{eval}$ in second reading, even if the control of this parameter is not as effective of the modulation of the pre-charge voltage $V_{CSO\_PRECH}$ of the first node CSO. The evaluation time $T_{eval}$ is equal to t2+t3 or t5+t6.

Modulating read current Itrip with different values from the first reading period, i.e., t1~t3, to the second reading period, i.e., t4~t6, can be useful to reduce distribution width. Having higher read current Itrip in the first reading period, i.e., t1~t3, would ensure that only strongly erased cells can flip the sense latch 31 at the first reading period, i.e., t1~t3, while more precise reading with target read current Itrip is performed at the second reading period, i.e., t4~t6. This avoids reading sensing cells marginally programmed as erased at the first reading, i.e., t1~t3. Reducing $V_{CSO\_PRECH}$ at the second reading period, for example, by ΔV3 as shown in FIG. 4A can be useful to this purpose.

Figure 4B:
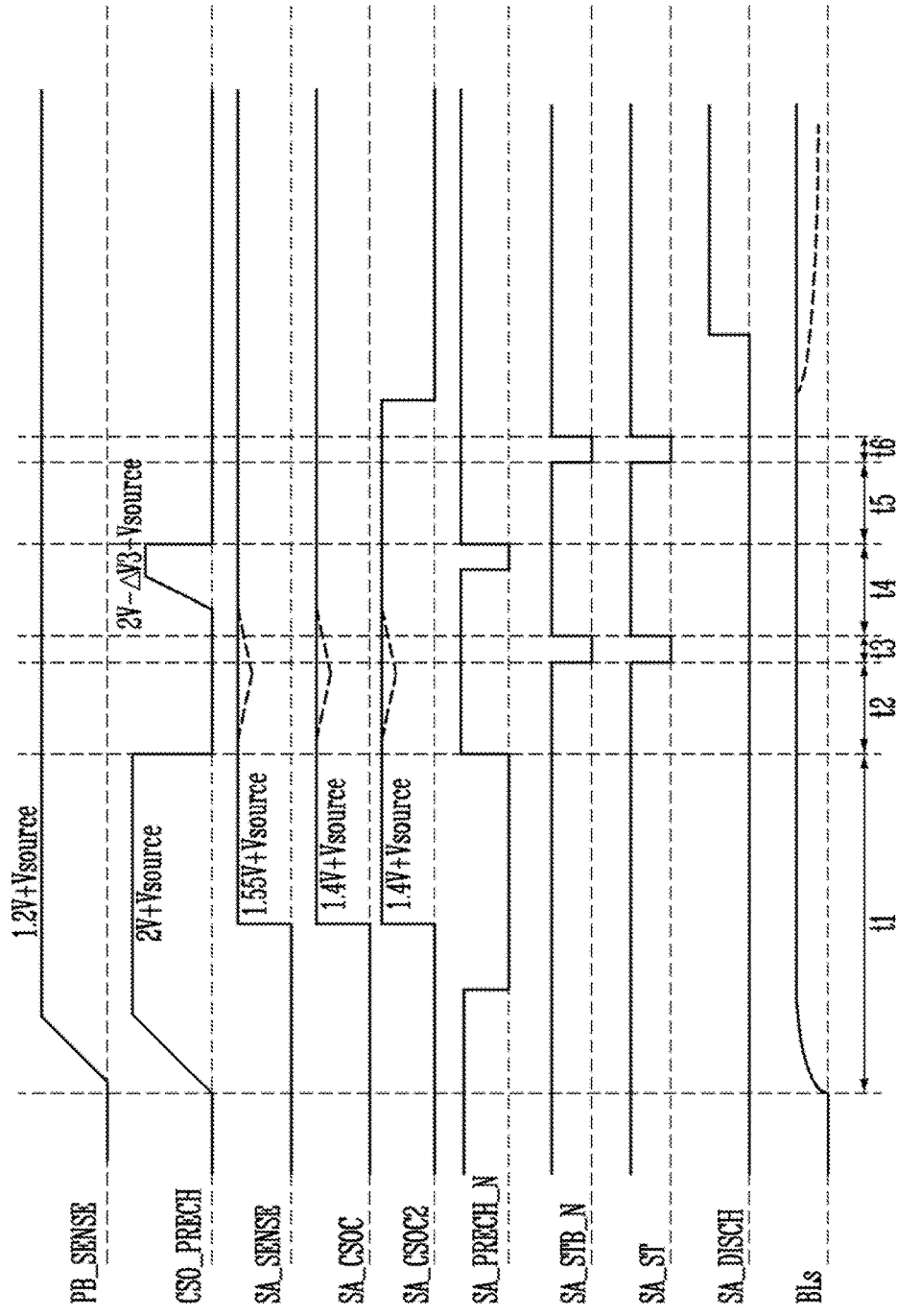
FIG. 4B shows a timing diagram of operation of the page buffer circuit according to FIG. 3, where source compensation technique is applied.

FIG. 4B shows a timing diagram of operation of the page buffer circuit 30-1 according to FIG. 3, where a source compensation technique is applied.

The source compensation technique is applied on the selected word-line voltage which is raised of the same amount of the source voltage, i.e. Vsource, thus keeping difference from cells gate to source voltage of the desired value independently on the source rising. The same approach is adopted with respect to the bit-line voltage BL in order to keep the desired drain to source voltage for the cells under reading. In order to do so, the page buffer control voltages such as PB_SENSE, CSO_PRECH, SA_SENSE, SA_CSOC, and SA_CSOC2 are raised of the same amount of the source voltage Vsource, as shown in FIG. 4B.

Despite source compensation is applied and correct cell biasing is guaranteed, the noise produced by the sensing circuitry of the erased cells on the global control voltages can compromise the correct reading of the cells having their page buffers sharing the same control voltages. This is why, even in presence of a source compensation technique on word-line and bit-line voltages, the read time reduction cannot be achieved with single sensing without compromising the reading or at least widening the cells distributions. In order to solve this issue, without increasing the read time significantly, the sequence of FIG. 4B can be adopted where the page buffer circuit comprises a third switching circuit M3 having the gate biased by the gate voltage SA_CSOC2, as shown in FIG. 3.

Figure 5:
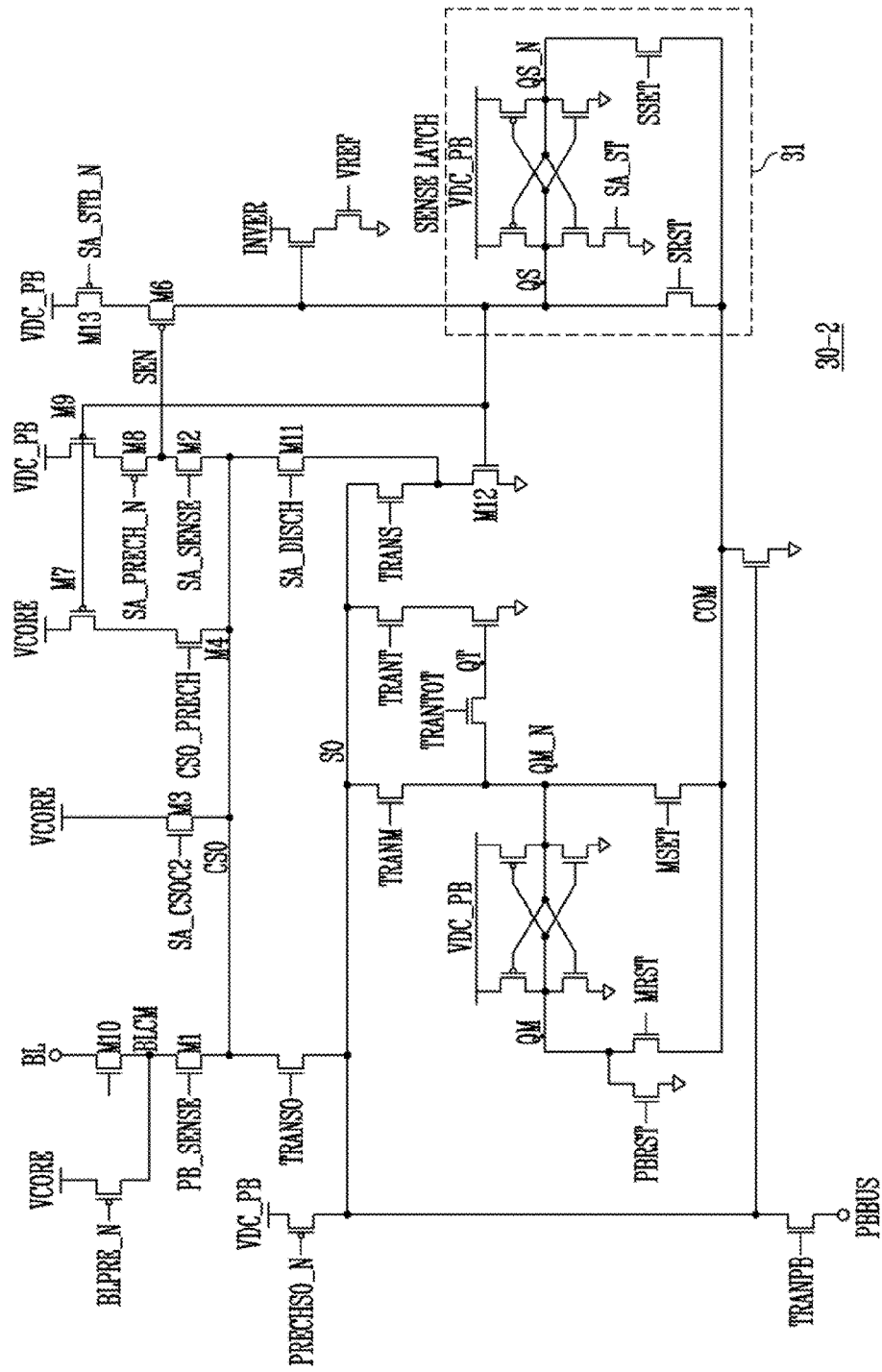
FIG. 5 shows a circuit diagram illustrating a page buffer circuit, according to a second embodiment of the invention.

FIG. 5 shows a page buffer circuit 30-2 according to a second embodiment of the invention.

Referring to FIG. 5, the page buffer 30-2 is different from that of the first embodiment of FIG. 3 in that the fifth switching circuit M5, i.e. the fifth NMOS transistor M5, is omitted. Since the third switching circuit, i.e. the third NMOS transistor M3, is configured to prevent the voltage value of the first node CSO from being lower than the gate voltage of the third NMOS transistor M3 minus the threshold voltage $V_{th\_M3}$ of the third NMOS transistor M3 independently from the voltage at the input node QS of the sense latch 31 which is determined based on the voltage level of the sensing node SEN of a strobe period t3 or t6, the fifth switching circuit M5 which serves a similar function as the third switching circuit M3 can be omitted, as shown in FIG. 5, indeed.

Control signals of FIGS. 4A and 4B can be driven to the page buffer circuit 30-2 of FIG. 5 identically.

Figure 6:
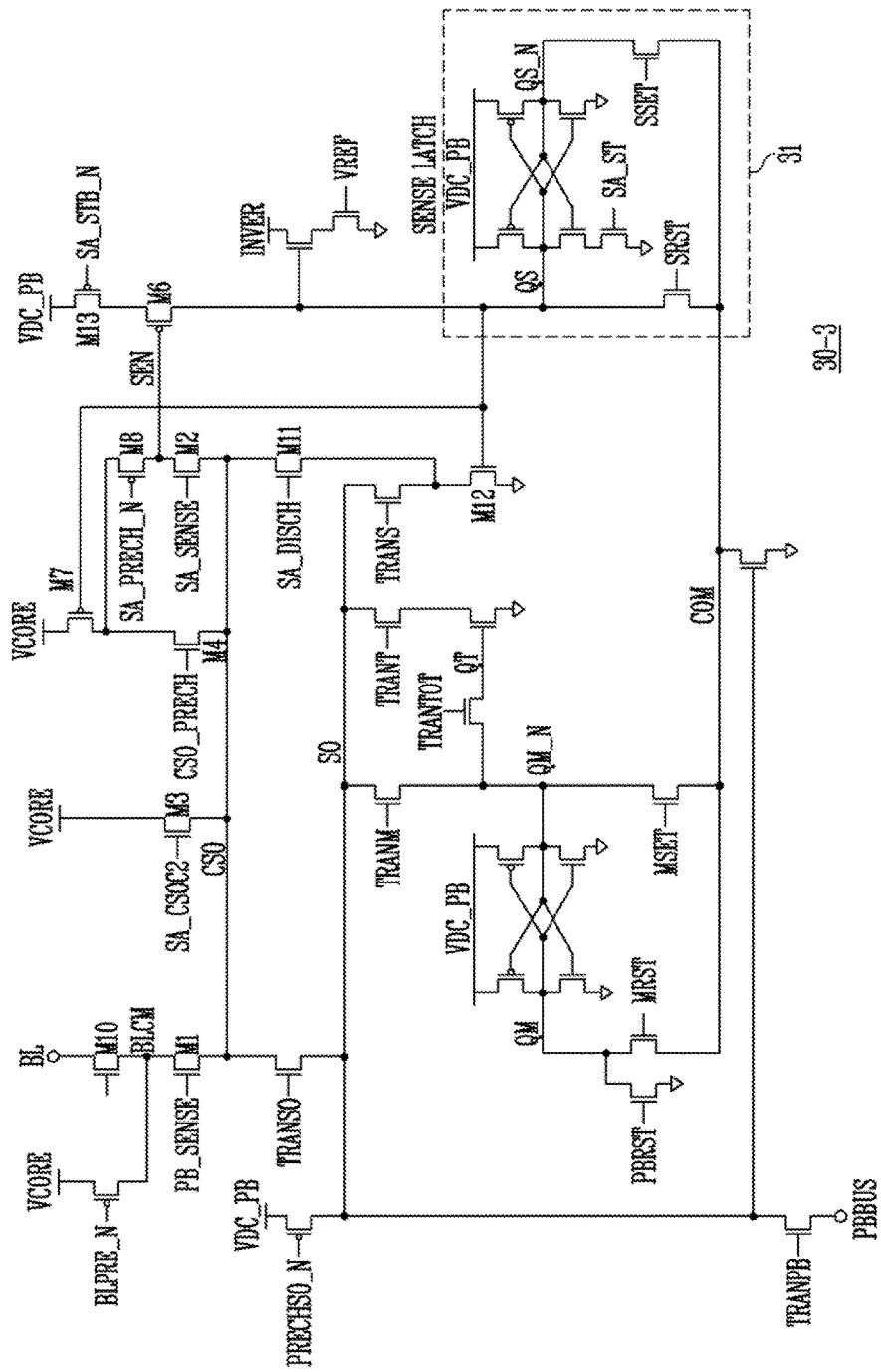
FIG. 6 shows a circuit diagram illustrating a page buffer circuit, according to a third embodiment of the invention.

FIG. 6 shows a page buffer circuit 30-3 according to a third embodiment of the invention.

Referring to FIG. 6, the difference from the second embodiment of FIG. 5 is that the third PMOS transistor M8 is coupled with the second PMOS transistor M7. In other words, the sensing node SEN is charged by the first voltage source VCORE during the pre-charge period t1. The fourth PMOS transistor M9 of the second embodiment is not necessary for the embodiment. Control signals of FIGS. 4A and 4B can be driven to the page buffer circuit 30-3 of FIG. 5 identically.

FIG. 7 shows a timing diagram of the control sequences where the relative length of strobe period t3 and t6 are increased.

Another way to improve noise immunity is to increase the strobe period t3 or t6, eventually reducing the evaluation period t2 or t5 of the same amount if necessary to keep same Itrip current target level of the Equation 1.

Figure 2A:
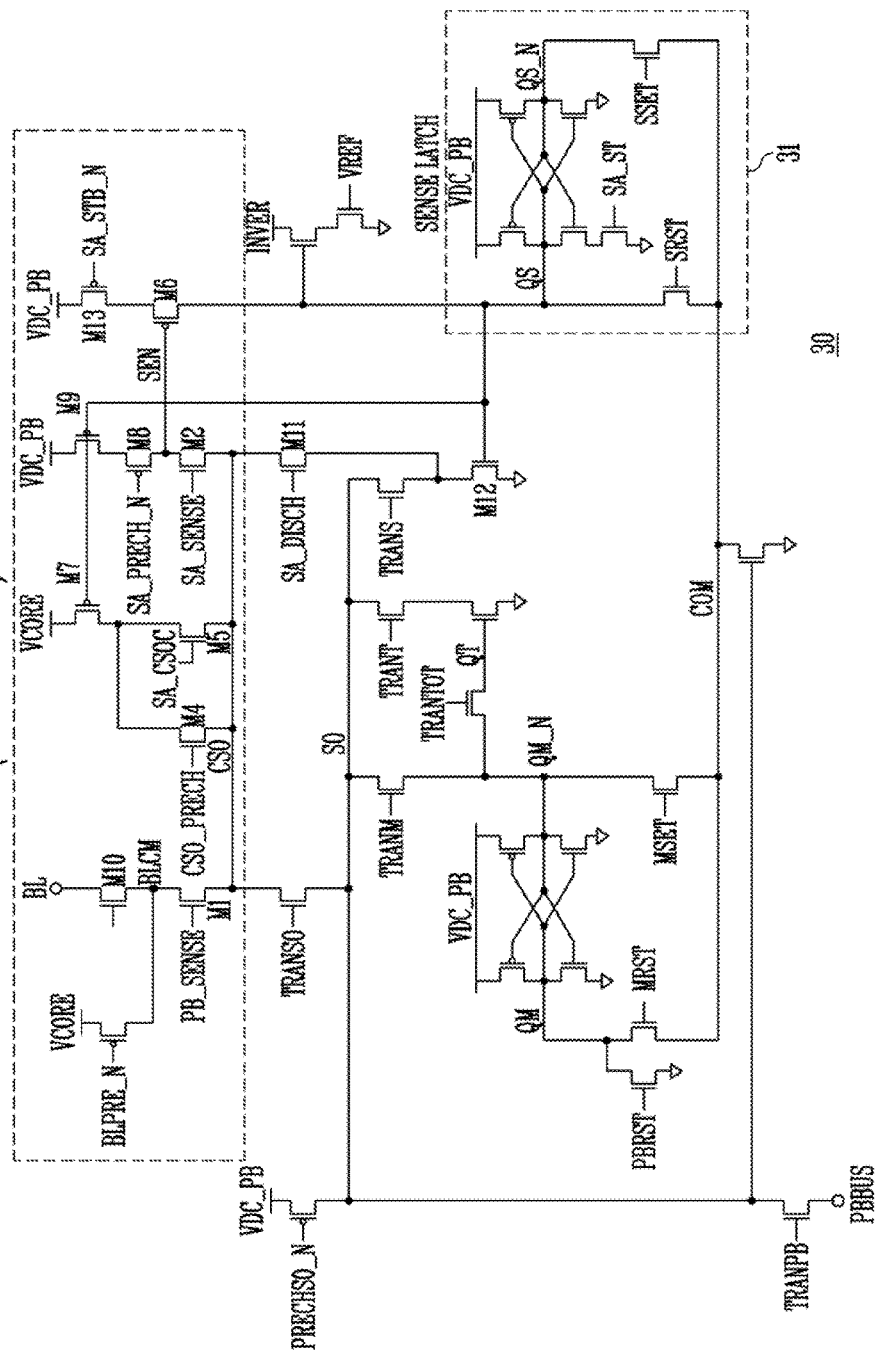
FIG. 2A shows a circuit diagram illustrating a conventional page buffer circuit suitable to perform a current sensing.

In current sensing of the prior art, the strobe period t3 or t6 is forced to be as short as possible due to the fact that when the input QS of the sense latch 31 of FIG. 2A rises, in case of an erased cell, the bit-line is left floating. Being it discharged by the cell current and coupled to adjacent bit-line, a long strobe time would result in a high bit-line to bit-line interference. On the other hand, with short strobe pulse period t3 or t6, all the inputs QS of the sense latch are charged at the same time and produce an instantaneous drop of the second voltage source VDC_PB, which could prevent the sixth switching circuit M6, i.e. the sensing transistor, to turn on. Thus, short strobe pulse period may affect the read precision or cause a read failure.

In the embodiments, all bit-lines BLs are forced to have the same value through the gate voltage SA_CSOC2 of the third switching circuit M3 even if the seventh switching circuit M7 is turned off, and the strobe period t3 or t6 can be increased if compensated by the reduction of the evaluation time $T_{eval}$, i.e., t2+t3. The only limit to the duration of the strobe period t3 or t6 is thus given by the leakage of the sensing node SEN. By this way, the most erased cells are allowed to flip the sense latch 31 first and the current peak from the second voltage source VDC_PB supply can be distributed throughout the whole strobe period t3 or t6. Another possible improvement to guarantee a higher margin to flip the sense latch 31 could be increasing supply for the ninth and thirteen switching circuits M9 and M13 and the PMOS well of the sense latch 31, within the limits of a threshold.

FIG. 8 shows a timing diagram of program verify sequences according to the prior art.

In the program verify sequences, the program level of the cell is first verified at one level, a bit lower than a target value, during t1~t6 and then verified with a higher word-line level which corresponds to the final threshold target value, during t7~t9 of FIG. 8. In other words, the voltage level of the selected word-line WL is raised during the periods t7~t9. When the cell has passed first program verify level but not the final one, the cell can be programmed again with reduced programming efficiency with various techniques. For example, the cell can be programmed with higher bit-line and channel voltage than ground voltage in order to avoid over programming.

Usually a first read sequence is applied with a lower value on selected word-line WL, wherein the first read sequence includes the pre-charge period t1, the first evaluation period t2, the first strobe period t3, the recovery period t4, the second evaluation period t5, and the second strobe period t6.

After this, the data is eventually stored in another latch read from the sense latch 31, and the voltage of the selected word-line WL is raised to the final program verify value. Then, only the second recovery period t7, and the third evaluation period t8 and the third strobe period t9 are repeated. This sequence relies on the fact that the voltage difference between the first program verify and the second one is low (i.e., 200 mV) so that only a few cells will be in the on state during the last reading with the high program verify voltage. In this way, the source rise and the sensing noise are reduced.

FIG. 9 shows a timing diagram of program verify sequences applicable to the first, second, and third embodiments of the invention.

Proposed dual step sensing program verify sequence relies on the similar principle and is described in FIG. 8. A first reading with dual step sensing is performed with a final word-line voltage WL from the first sensing, but a higher pre-charge value CSO_PRECH of the node CSO and/or a shorter evaluation time $T_{eval}$, i.e., t2+t3. Read data are then saved in another latch. In order to achieve a different program verify level, the read current is then reduced for the second sensing and set as in read operation by decreasing the pre-charge value CSO_PRECH of the node CSO and/or increasing the evaluation time $T_{eval}$. With these conditions, the last read operation can be performed without modifying the stack condition, i.e. a voltage increase of the word-line WL. As shown in FIG. 9, the voltage level of the bit-lines can remain constant, which prevents the necessity of a long bit-line recovery time.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A flash memory including a bit-line and a page buffer circuit, the page buffer circuit comprising:
   a first node;
   a first switching circuit arranged between the first node and the bit-line, configured to pre-charge the bit-line based on a voltage provided to the first switching circuit, during a pre-charge period;
   a sensing node;
   a second switching circuit arranged between the first node and the sensing node, configured to discharge the sensing node when a voltage value of the first node is lower than a voltage value associated with a voltage inputted to the second switching circuit, during an evaluation period;
   a sense latch configured to latch a voltage being determined based on a voltage level of the sensing node, during a strobe period; and
   a third switching circuit configured to prevent the voltage value of the first node from being lower than a voltage value associated with a voltage inputted to the third switching circuit independently from a voltage at the sense latch, during the strobe period,
   wherein the third switching circuit is provided with a first voltage source as a power supply, and the sense latch is provided with a second voltage source as the power supply.

2. The flash memory of claim 1, wherein the first switching circuit comprises a first NMOS transistor.

3. The flash memory of claim 2, wherein the voltage provided to the first switching circuit to pre-charge the bit-line is determined by a voltage provided to a gate of the first NMOS transistor minus a threshold voltage of the first NMOS transistor.

4. The flash memory of claim 1, wherein the second switching circuit comprises a second NMOS transistor.

5. The flash memory of claim 4, wherein the second NMOS transistor is configured to discharge the sensing node when the voltage value of the first node is lower than a gate voltage of the second NMOS transistor minus a threshold voltage of the second NMOS transistor during the evaluation period.

6. The flash memory of claim 1, wherein the third switching circuit comprises a third NMOS transistor, and the first node is electrically coupled to one terminal of the third NMOS transistor, and a voltage from the first voltage source is provided to the other terminal of the third NMOS transistor.

7. The flash memory of claim 6, wherein the third NMOS transistor is configured to prevent the voltage value of the first node from being lower than a gate voltage of the third NMOS transistor minus a threshold voltage of the third NMOS transistor.

8. The flash memory of claim 1, wherein the page buffer circuit further comprises:
   a fourth switching circuit configured to provide a pre-charging path to the bit-line through the first node and the first switching circuit from the first voltage source during the pre-charge period.

9. The flash memory of claim 8, wherein the pre-charging path does not include the sensing node.

10. The flash memory of claim 8, wherein the fourth switching circuit comprises a fourth NMOS transistor.

11. The flash memory of claim 10, wherein, during the pre-charge period, the fourth NMOS transistor is configured to raise the voltage value of the first node up to a gate voltage of the fourth NMOS transistor minus the threshold voltage of the fourth NMOS transistor.

12. The flash memory of claim 8, wherein the page buffer circuit further comprises:
   a fifth switching circuit configured to prevent the voltage value of the first node from being lower than a voltage value associated with a voltage inputted to the fifth switching circuit.

13. The flash memory claim 12, wherein the fourth switching circuit comprises a fourth NMOS transistor and the fifth switching circuit comprises a fifth NMOS transistor, and wherein drain and source of the fourth NMOS transistor are electrically coupled with drain and source of the fifth NMOS transistor, respectively.

14. The flash memory of claim 12, the page buffer circuit further comprises:
   the second voltage source; and
   a sixth switching circuit coupled with the sensing node, configured to switch a path from the second voltage source to the sense latch, wherein the sense latch is configured to receive a voltage based on the voltage outputted from the sixth switching circuit to enable or disable a current path from a voltage source to the second, fourth, and fifth switching circuits based on the voltage received in the sense latch.

15. The flash memory of claim 14, wherein the sixth switching circuit comprises a first PMOS transistor, and the sensing node is electrically coupled to a gate of the first PMOS transistor, and one terminal of the first PMOS transistor is electrically coupled to an input of the sense latch.

16. The flash memory of claim 14, the page buffer circuit further comprises:
a seventh switching circuit configured to switch current paths from the first voltage source to the second, fourth, and fifth switching circuits based on a voltage of an input of the sense latch.

17. The flash memory of claim 16, wherein the seventh switching circuit comprises a second PMOS transistor, and a gate of the second PMOS transistor is electrically coupled with the input of the sense latch.

18. The flash memory of claim 16, the page buffer circuit further comprises;
an eighth switching circuit configured to charge the sensing node during the pre-charge period up to a voltage of the first voltage source or the second voltage source.

19. The flash memory of claim 18, wherein the eighth switching circuit comprises a third PMOS transistor, and a gate voltage of the third PMOS transistor is controlled to pre-charge the sensing node.

20. The flash memory of claim 18, the page buffer circuit further comprises:
a ninth switching circuit configured to switch a current path from the second voltage source to the sensing node based on the voltage of the input of the sense latch.

21. The flash memory of claim 19, wherein a ninth switching circuit comprises a fourth PMOS transistor, and a gate of the fourth PMOS transistor is electrically coupled with the input of the sense latch.

22. The flash memory of claim 1, wherein the sensing node is isolated from the first node during the pre-charge period.

23. The flash memory of claim 12, wherein voltages provided to each of the first, second, third, fourth and fifth switching circuits are defined as V1, V2, V3, V4, and V5 respectively, and wherein during at least a portion of interval of the pre-charge period the following conditions are met : V4>V2>V3=V5>V1.

24. The flash memory of claim 23, wherein a read current on the sensing node is configured to be modulated by controlling the difference of V4 and V2.

25. The flash memory of claim 1, wherein a read current on the sensing node is configured to be modulated by controlling the evaluation period and/or the strobe period.

26. The flash memory of claim 14, wherein the strobe period is increased sufficiently to such that instantaneous voltage drop of the second voltage source does not affect an operation of the sixth switching circuit.

* * * * *